(12) United States Patent
Ladner et al.

(10) Patent No.: US 6,552,937 B2
(45) Date of Patent: Apr. 22, 2003

(54) MEMORY DEVICE HAVING PROGRAMMABLE COLUMN SEGMENTATION TO INCREASE FLEXIBILITY IN BIT REPAIR

(75) Inventors: Brian J. Ladner, Plano, TX (US); Daniel B. Penney, Wylie, TX (US)

(73) Assignee: Micron Technology, Inc., Boise, ID (US)

( * ) Notice: Subject to any disclaimer, the term of this patent is extended or adjusted under 35 U.S.C. 154(b) by 65 days.

(21) Appl. No.: 09/818,617

(22) Filed: Mar. 28, 2001

(65) Prior Publication Data

US 2002/0141254 A1 Oct. 3, 2002

(51) Int. Cl.$^7$ ................................. G11C 7/00
(52) U.S. Cl. ............. 365/200; 365/189.07; 365/185.09
(58) Field of Search ..................... 365/200, 189.07, 365/185.09

(56) References Cited

U.S. PATENT DOCUMENTS

| | | | | |
|---|---|---|---|---|
| 5,457,655 A | * | 10/1995 | Savignac et al. | 365/200 |
| 5,619,460 A | * | 4/1997 | Kirihata et al. | 365/201 |
| 5,822,256 A | * | 10/1998 | Bauer et al. | 365/200 |
| 6,373,758 B1 | * | 4/2002 | Hughes et al. | 365/200 |
| 6,418,068 B1 | * | 7/2002 | Raynham | 365/200 |

* cited by examiner

Primary Examiner—Son T. Dinh
Assistant Examiner—Tuan T. Nguyen
(74) Attorney, Agent, or Firm—Dickstein, Shapiro, Morin & Oshinsky, LLP (57) ABSTRACT

A method and apparatus for programmable column segmentation of a memory device is disclosed. The method and apparatus provide different programmable selected column segmentation arrangements to provide more flexibility in primary column repair of a memory device.

24 Claims, 9 Drawing Sheets

FIG. 1
PRIOR ART

| ROW ADD 3 | ROW ADD 2 | ROW ADD 1 | ROW ADD 0 | |
|---|---|---|---|---|
| 1 | 1 | 1 | 1 | ROW 15 |
| 1 | 1 | 1 | 0 | ROW 14 |
| 1 | 1 | 0 | 1 | ROW 13 |
| 1 | 1 | 0 | 0 | ROW 12 |
| 1 | 0 | 1 | 1 | ROW 11 |
| 1 | 0 | 1 | 0 | ROW 10 |
| 1 | 0 | 0 | 1 | ROW 9 |
| 1 | 0 | 0 | 0 | ROW 8 |
| 0 | 1 | 1 | 1 | ROW 7 |
| 0 | 1 | 1 | 0 | ROW 6 |
| 0 | 1 | 0 | 1 | ROW 5 |
| 0 | 1 | 0 | 0 | ROW 4 |
| 0 | 0 | 1 | 1 | ROW 3 |
| 0 | 0 | 1 | 0 | ROW 2 |
| 0 | 0 | 0 | 1 | ROW 1 |
| 0 | 0 | 0 | 0 | ROW 0 |

*ROW ADDRESS TABLE*

| ROW ADD 3 | ROW ADD 2 | 206 a | 206 b | 206 c | 206 d |
|---|---|---|---|---|---|
| 1 | 1 | 1 | 0 | 1 | 0 |
| 1 | 0 | 1 | 0 | 0 | 1 |
| 0 | 1 | 0 | 1 | 1 | 0 |
| 0 | 0 | 0 | 1 | 0 | 1 |

| ROW ADD 2 | ROW ADD 1 | 260 a | 260 b | 260 c | 260 d |
|---|---|---|---|---|---|
| 1 | 1 | 1 | 0 | 1 | 0 |
| 1 | 0 | 1 | 0 | 0 | 1 |
| 0 | 1 | 0 | 1 | 1 | 0 |
| 0 | 0 | 0 | 1 | 0 | 1 |

FIG. 8

| ROW ADD 2 | ROW ADD 1 | | | |
|:---:|:---:|:---:|:---:|:---|
| 1 | 1 | } | ROW 15 | COLUMN SEGMENT 3 |
|   |   |   | ROW 14 |   |
| 1 | 0 | } | ROW 13 | COLUMN SEGMENT 2 |
|   |   |   | ROW 12 |   |
| 0 | 1 | } | ROW 11 | COLUMN SEGMENT 1 |
|   |   |   | ROW 10 |   |
| 0 | 0 | } | ROW 9 | COLUMN SEGMENT 0 |
|   |   |   | ROW 8 |   |
| 1 | 1 | } | ROW 7 | COLUMN SEGMENT 3 |
|   |   |   | ROW 6 |   |
| 1 | 0 | } | ROW 5 | COLUMN SEGMENT 2 |
|   |   |   | ROW 4 |   |
| 0 | 1 | } | ROW 3 | COLUMN SEGMENT 1 |
|   |   |   | ROW 2 |   |
| 0 | 0 | } | ROW 1 | COLUMN SEGMENT 0 |
|   |   |   | ROW 0 |   |

COLUMN SEGMENTS REPEAT

FIG. 9

MEMORY DEVICE HAVING PROGRAMMABLE COLUMN SEGMENTATION TO INCREASE FLEXIBILITY IN BIT REPAIR

BACKGROUND OF THE INVENTION

I. Field of the Invention

The present invention relates to a method and apparatus for implementing memory repair using column segmentation.

II. Description of the Related Art

In order to ensure proper operation, semiconductor devices are typically tested before being packaged into a chip. A series of probes at a test station electrically contact pads on each die to access portions of the individual semiconductor devices on the die. For example, in a semiconductor memory device, the probes contact address pads and data input/output pads to access selected memory cells in the memory device. Typical dynamic random access memory ("DRAM") devices include one or more arrays of memory cells arranged in columns and rows. Each array of memory cells includes rows (word lines) that select memory cells along a selected row, and columns (bit lines or pairs of lines) that select memory cells along a column to read data from, or write data to, the selected memory cells in an memory array.

During a pretest, predetermined data is typically written to selected column and row addresses that correspond to certain memory cells, and then the data is read from those memory cells to determine if the read data matches the data written to those addresses. If the read data does not match the written data, then the memory cells at the selected addresses likely contain defects and the semiconductor device fails the test.

Many semiconductor memory devices include redundant columns of memory cells that can be employed to compensate for certain columns containing defective cells. As a result, by enabling such redundant circuitry, a tested memory device need not be discarded even if it fails a particular pretest. Thus, if a memory cell in a column of the primary memory array is defective, then an entire column of redundant memory cells can be substituted for the column of memory cells containing the defective cell.

For memory devices employing redundant columns, column segmentation is often used. Column segmentation involves partitioning each column of the primary and redundant memory arrays. Therefore, if a portion of a primary column is found to be defective, only that portion of the primary column need be replaced and by only a portion of a redundant column. This preserves redundant column space, as only a limited number of redundant columns need to be fabricated on a memory device. Therefore, a memory device with more defective primary columns than redundant columns need not be scrapped as long as the defective segments of the primary columns can be substituted by an available segment of a redundant column.

Traditional column segmentation is set uniformly across all primary and redundant columns. Thus, traditionally column segmentation provides several segments, where all of the rows of each particular column segment are arranged adjacent to one another and remain fixed in that arrangement. The arrangement is common across all primary and redundant columns. With this traditional fixed segmentation scheme it is possible, depending on the location of defective cells, to have fewer available redundant segments for repair than primary segments which need repair. In this case, the memory device would be unrepairable because some defective segments of the primary array do not have a substitute redundant segment available for repair. A more flexible and efficient column segmentation arrangement would be desirable.

SUMMARY OF THE INVENTION

The present invention provides a method and apparatus which provides more efficient and flexible column segmentation in a memory device utilizing redundant columns. The present invention provides for a programmable column segmentation arrangement in which the particular rows associated with a column segment can be changed permitting more flexibility in primary column repair.

Thus, after the primary columns have been analyzed for cell failures and after various column segmentation arrangements have been tested for optimum efficiency, a column segmentation arrangement can be selected to best suit the cell failures of the memory device.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF PREFERRED EMBODIMENTS

Before describing the invention, a conventional column segmentation device 200 which is used in memory devices and depicted in FIG. 2, will be described in connection with the row address table shown in the FIG. 1.

Figure 1:
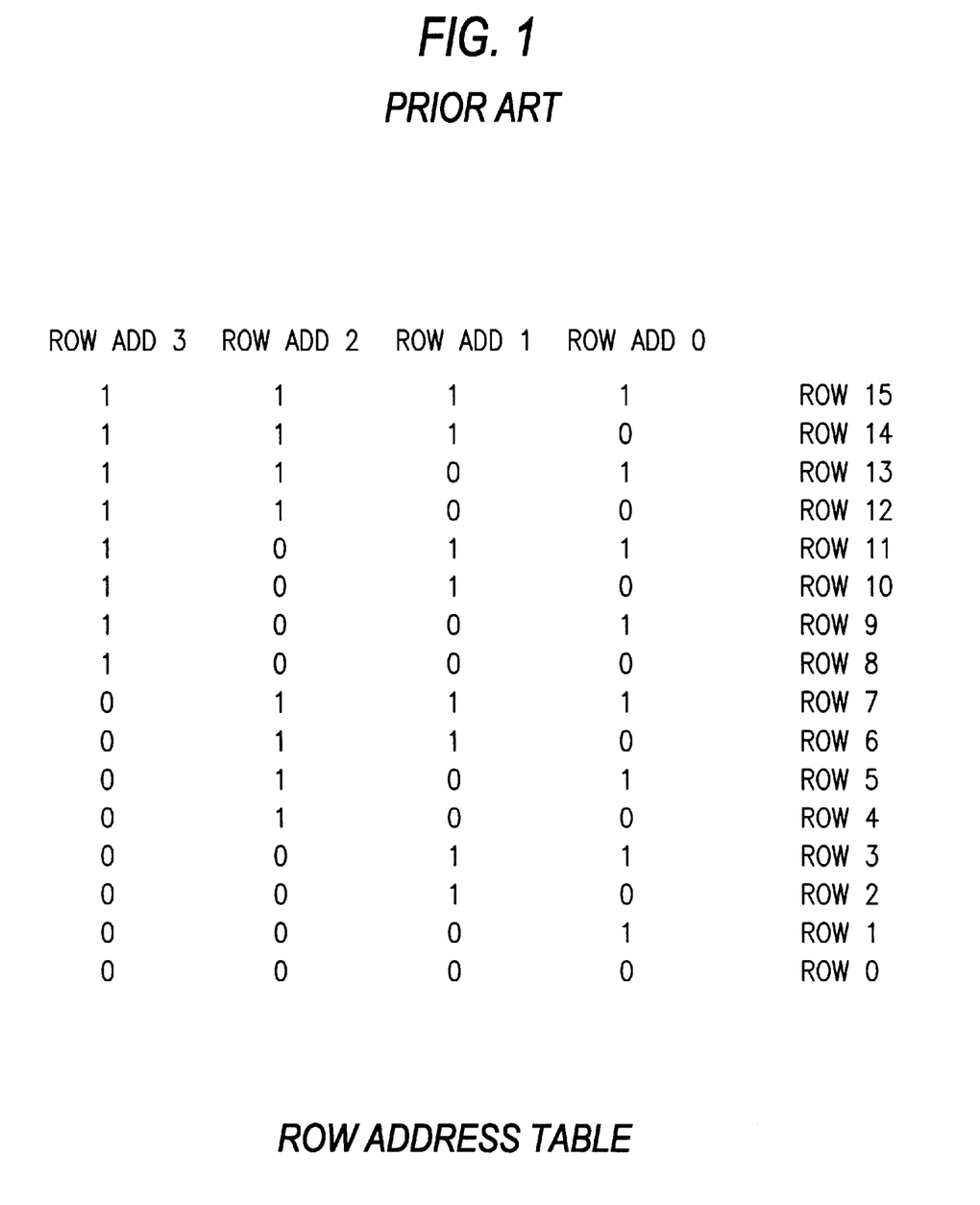
FIG. 1 shows a representative row address table for a memory device.

FIG. 1 illustrates a simplified row address table for a memory device. Only sixteen rows (word lines) are shown here for simplicity of explanation. In practice, an actual DRAM would have many more rows and the address table would be correspondingly larger. Each of the rows (0 . . . 15) has four address bits identified as RowAdd 0, RowAdd 1, RowAdd 2 and RowAdd 3 which uniquely identify a row.

Figure 2:
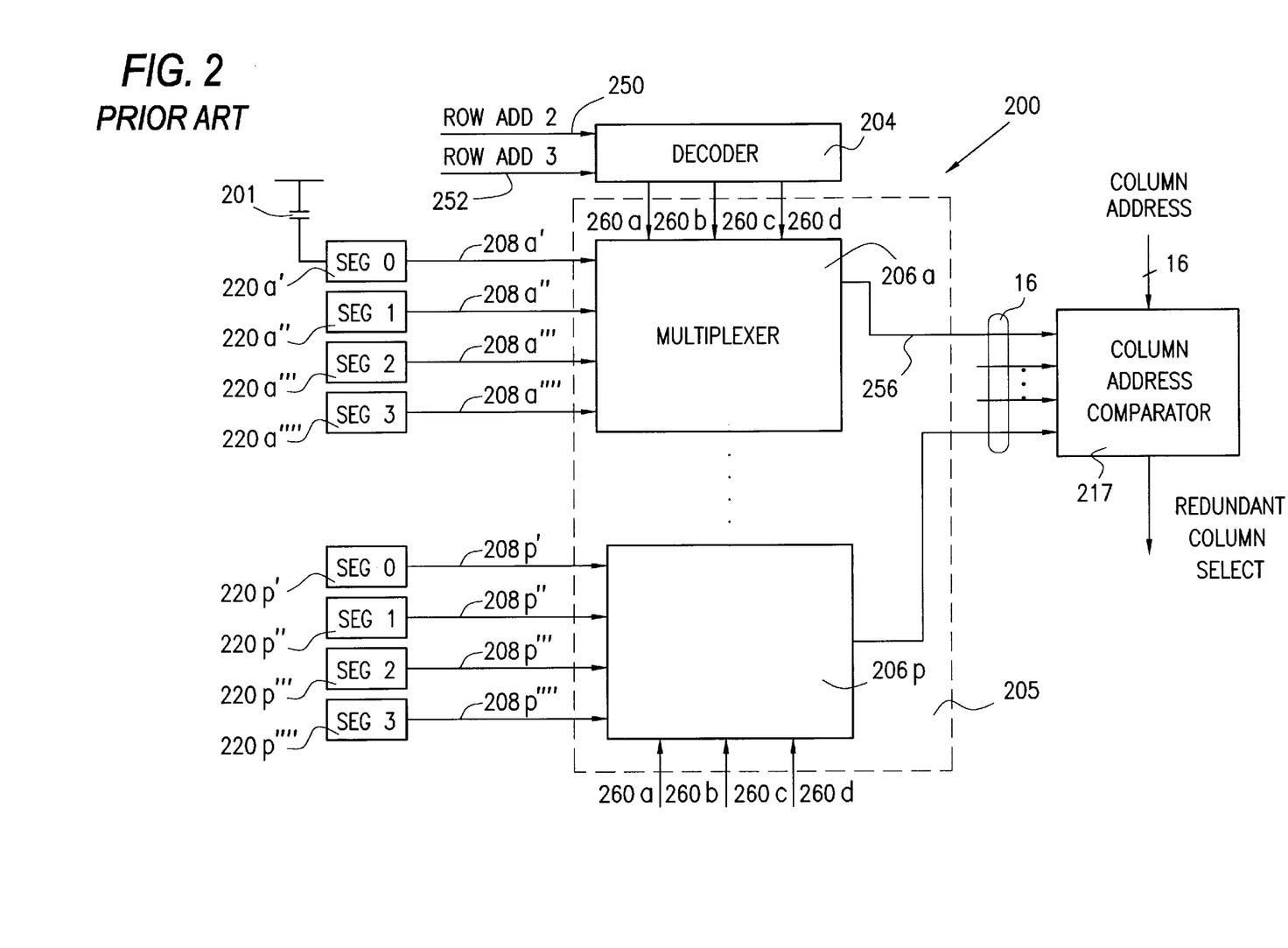
FIG. 2 illustrates a conventional column segmentation circuit for a memory device.

Referring to FIG. 2, the column segmentation device 200 includes two input lines 250, 252 connected as inputs to a segmentation decoder 204. These input lines 250, 252 respectively receive RowAdd 2 and RowAdd 3 bits from a presented row address signal.

Figure 5:
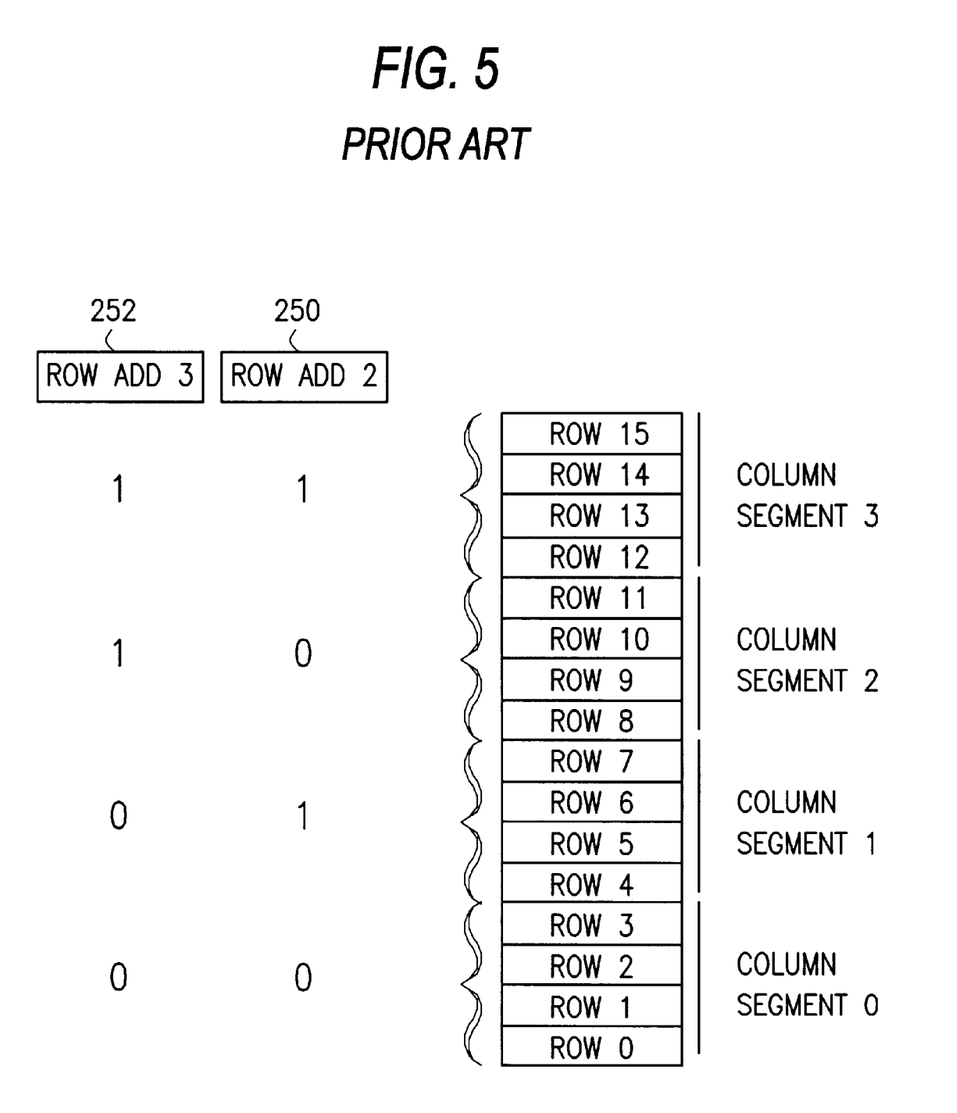
FIG. 5 is a chart illustrating column segmentation of a memory array based upon the conventional segmentation circuit of FIG. 2.

As shown in FIG. 5, the RowAdd 2 and RowAdd 3 logic levels can be used to identify four separate groups of rows, that is, four column segments. For example, as shown in FIG. 5, rows 15-12 are identified as column segment 3 by the bit pattern "11," rows 11-8 are identified as column segment 2 by the bit pattern "10," rows 7-4 are identified as column segment 1 by the bit pattern "01," and rows 3-0 are identified as the column segment 0 by the bit pattern "00." Each of the above segments contains four adjacent rows. Decoder 204 provides a decoded output on lines 260a, 260b, 260c, and 260d in response to the RowAdd 2 and Row Add3 bits, which corresponds to one of the four segments (row groups) in a column.

Figure 3:
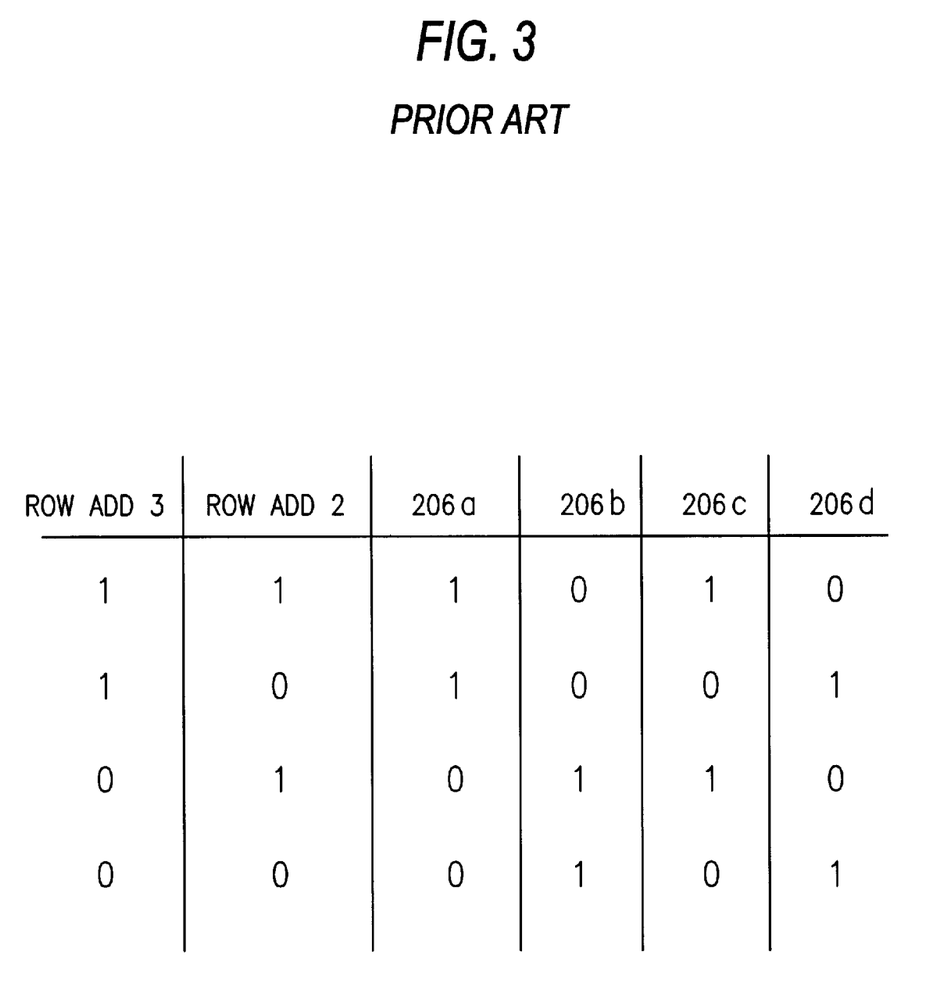
FIG. 3 is a table illustrating the input and output states of a decoder of the FIG. 2 circuit.

Decoder 204 is a very simple circuit containing signal inverters. It receives the RowAdd 2 and RowAdd1 bits and respectively provides as an output signal on lines 260a, 260b, 260c and 260d the bits RowAdd 3, $\overline{\text{RowAdd 3}}$, RowAdd 2, and $\overline{\text{RowAdd 2}}$. FIG. 3 is a table which shows the four possible combinations of inputs signals RowAdd 2 and RowAdd 3 and the corresponding decoded output on lines 260a, 260b, 260c, and 260d. Each unique combination of RowAdd2 and RowAdd3 logic bits ("11," "10," "01," "00") yields a unique decoded output. Each unique decoded output indicates one of four column segments to a switching circuit 205 formed by a plurality of multiplexer circuits 206a . . . 206p. In the illustrated circuit there is one multiplexer circuit 206a . . . 206p for each bit position of a column address of a memory device. Assuming use of a sixteen-bit column address, there will be sixteen multiplexers 206a . . . 206p. Each multiplexer 206 receives the segment selection signals at the output of decoder 204 as control signals to select one of the inputs on lines 208a' . . . a'''' . . . 208p' . . . 208p'''' and pass it to a respective output line 256. The input lines 208a' . . . 208a'''' . . . 208p' . . . p'''' are respectively coupled to latch circuits 220a' . . . a'''' . . . 220p' . . . p'''' respectively associated with a programmable element 201 such as a fuse or antifuse, only one of which is shown in FIG. 2. The fuses/antifuses 201 are used to program into the latches 220 the addresses of the defective columns for each of the four column segments. Thus, as shown in FIG. 2, each of the four latches for each multiplexer 206 contains a programmed column bit value for a respective one of the column segments 3, 2, 1, 0.

A defective bit in a column segment of a primary array is indicated by identifying the column address associated with the segment containing a defective bit. The indication of defective bits is programmed by the fuses or antifuses 201, and the programmed state of each fuse or antifuse is set into a corresponding latch 220. Thus, if a particular column segment (3, 2, 1, 0) contains a defective bit, when the segment, e.g., 3, is indicated by the output of the decoder 204, a latch corresponding to that segment is selected by each multiplexer 206 for each of the sixteen bits of a column address to thereby indicate a defective column address.

The collective sixteen bit output of the multiplexers 206 on respective output lines 256 are applied to a column address comparator 217, and when a column address is presented for a memory operation which matches the address for the defective column from the multiplexers 206, a redundant column is selected in place of the primary column corresponding to the indicated defective column address.

Figure 4:
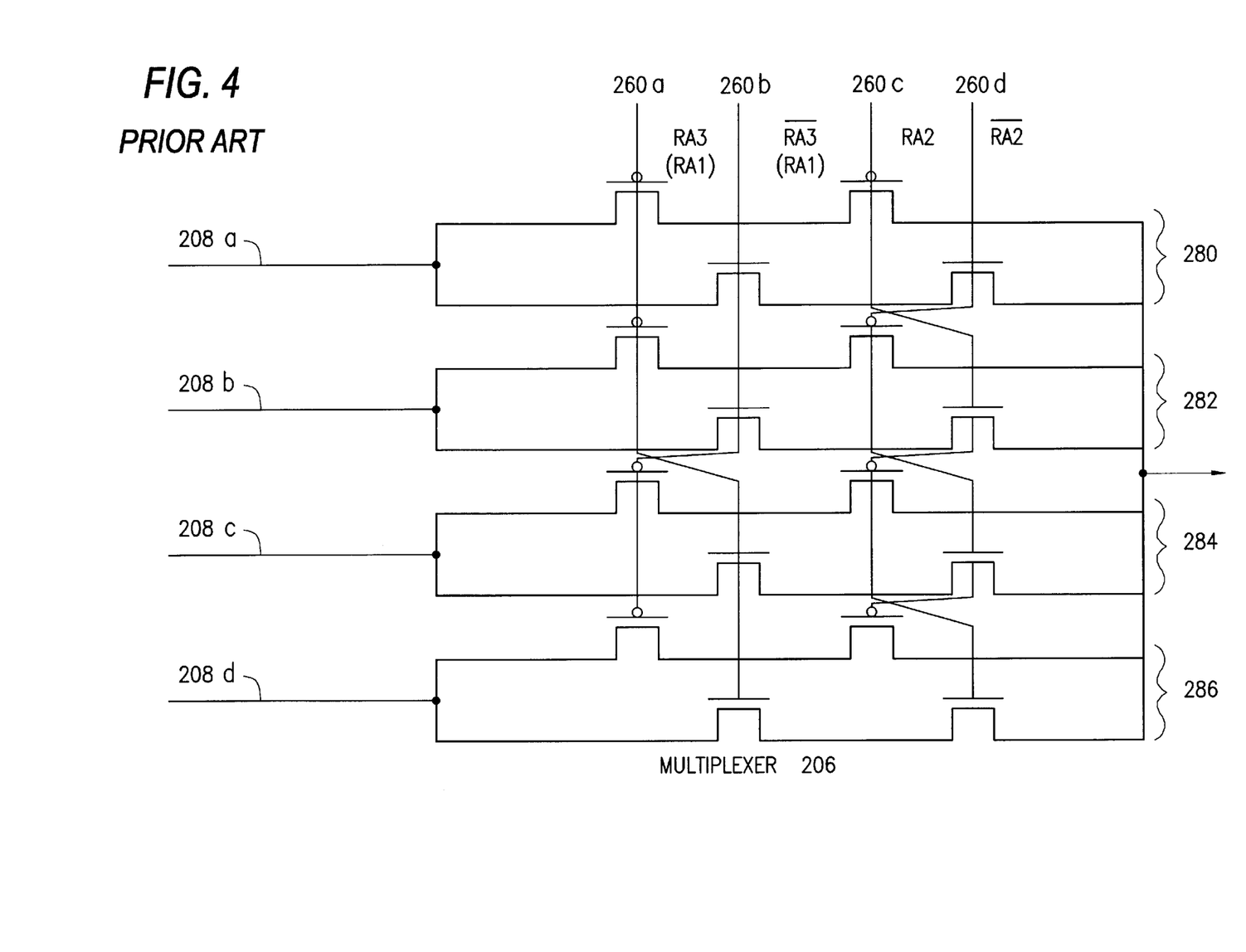
FIG. 4 is an exemplary multiplexer used in the FIG. 2 circuit.

FIG. 4 provides a detailed illustration of an exemplary multiplexer 206. As can be seen, when the column multi-plexer 206 is presented with the decoded output RowAdd 3, $\overline{\text{RowAdd 3}}$, RowAdd 2, $\overline{\text{RowAdd 2}}$ on lines 260a, 260b, 260c, and 260d, only one of the four banks of transistors 280, 282, 284, 286 are placed in a conductive state, thus allowing the defective primary column from the selected segment to pass through the multiplexers 206. The exemplary column multiplexer 206 may be any type of switching logic which yields the same results based upon the decoded output received from the decoder 204.

As an example of the operation of the FIG. 2 circuit, assume row 15 is selected for a memory operation, and further assume column 3 of row 15 contains a defective cell and the column address for this defective cell is programmed in the latches 220. The column 15 row address represented by "1 1 1 1" is presented to a memory device. In this case, the input line 252 receives a high signal, "1", (RowAdd 3) and input line 250 receives a high signal, "1" (RowAdd 2), and a column segment 3 containing row 15 is identified. The decoder 204 decodes these inputs to produce a 4-bit signal ("1 0 1 0") on lines 260a, 260b, 260c, 260d (see FIG. 2) which controls the multiplexers 206a . . . 206p to pass a defective column address bit pattern for column 3 precisely set into the latches 220 for segment 3. When the sixteen-bit address for column 3 is presented to comparator 217, it matches the address for defective column 3 passed by the multiplexers 206 and a redundant column is selected.

Depending on where defective cells are located in the primary array, the memory device may not have a sufficient number of available cells in the redundant column segments assigned to the primary columns to repair out all defective cells in columns of the primary memory array.

In order to reduce the number of unrepairable memory devices, the present invention provides for programmable selection of a segmentation arrangement for columns of the primary memory array based upon the row address of the defective cell.

Figure 6:
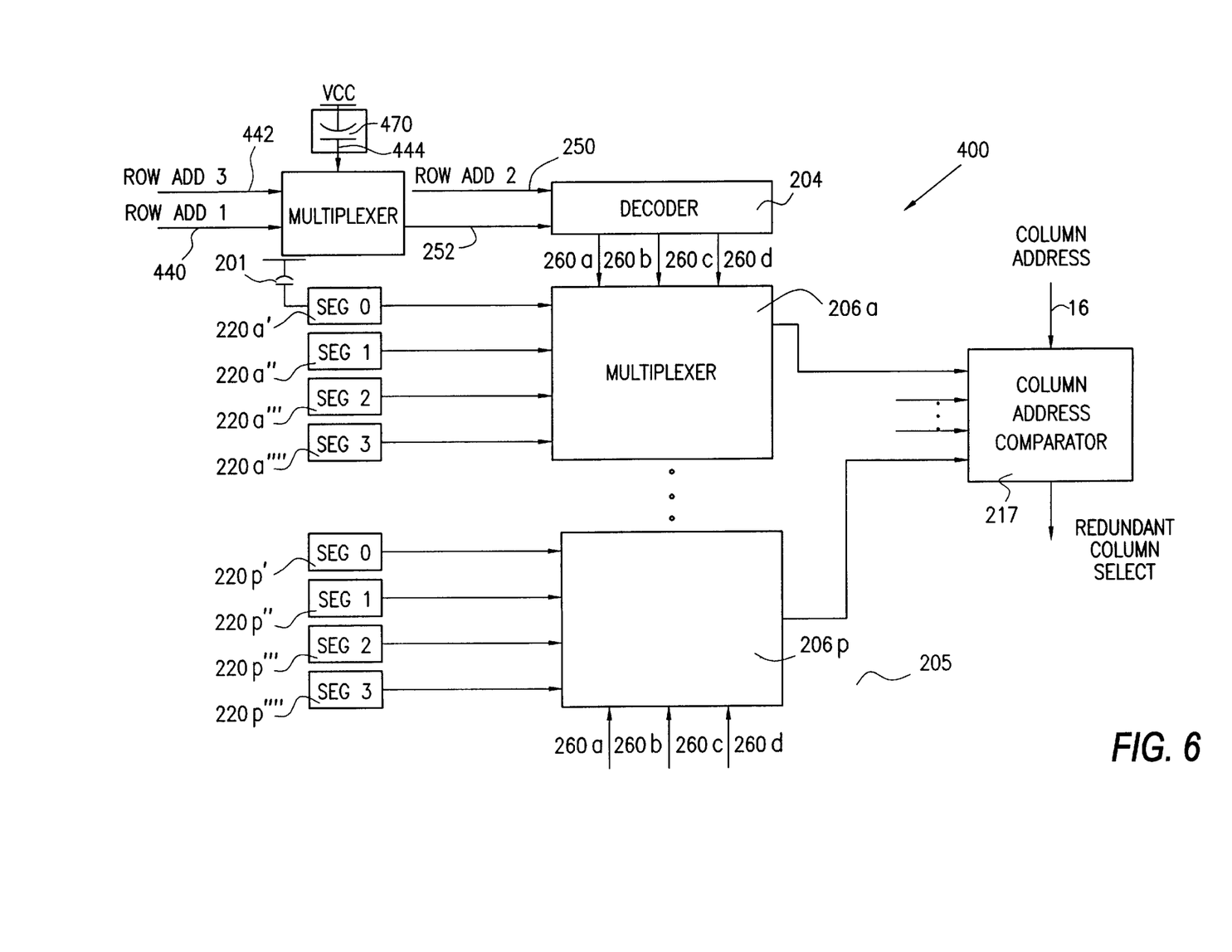
FIG. 6 illustrates a programmable column segmentation circuit in accordance with an exemplary embodiment of the present invention.

FIG. 6 illustrates an exemplary embodiment of the invention. It differs from FIG. 2 in that the decoder 204 receives the RowAdd2 bit on input line 250, as in FIG. 2, but now decoder 204 receives either the RowAdd 3 bit, as in the FIG. 2 arrangement on line 442, or a RowADD1 bit on line 440 on input line 252, depending on the programmed condition of a switch 402, e.g., a multiplexer, controlled by program-mable line 444 which is connected to a programmable element 470 which may be either a fuse or antifuse. Thus, in one state of programming of element 470, decoder 204 receives the RowAdd2 and RowAdd3 input signals, as in FIG. 2, and operates as described above with reference to FIG. 2, while in the other state of programming of element 444, the decoder 204 receives the RowAdd2 and RowAdd1 bits as input signals, and the FIG. 6 circuit operates differently from the FIG. 2 circuit.

Figure 7:
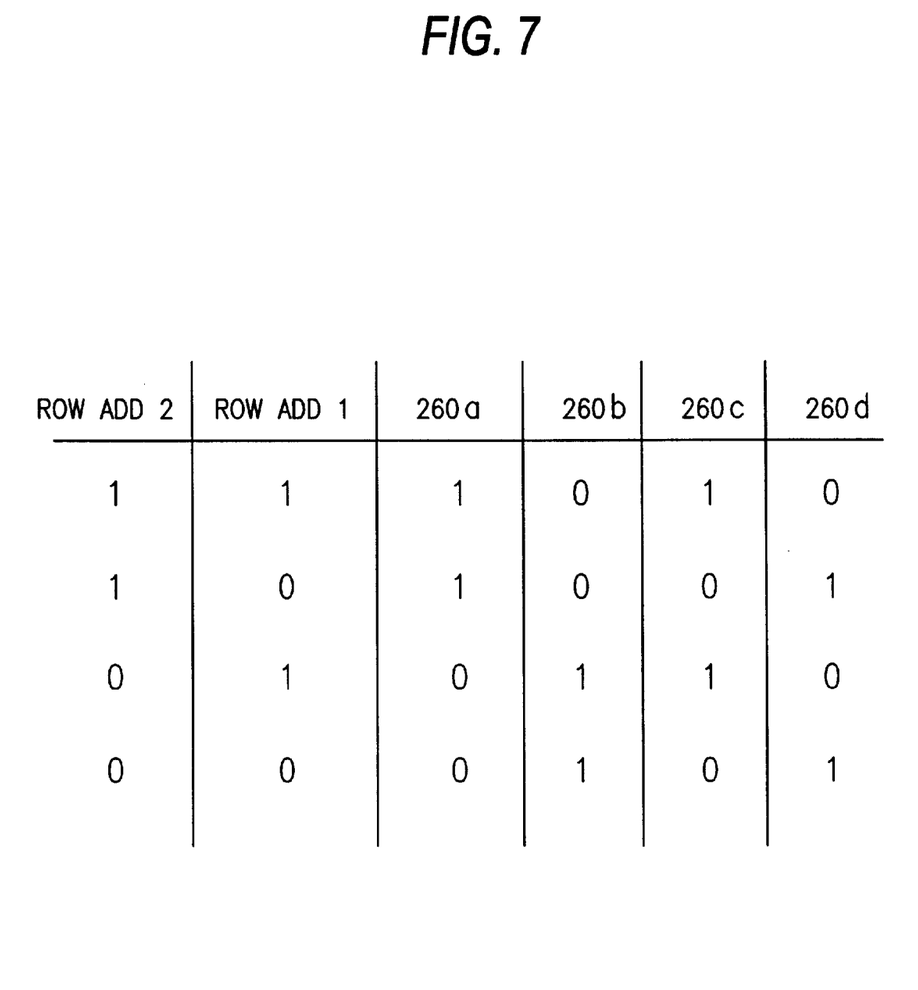
FIG. 7 is table illustrating the input and output states of the segmentation decoder depicted in the FIG. 6 circuit.
Figure 8:
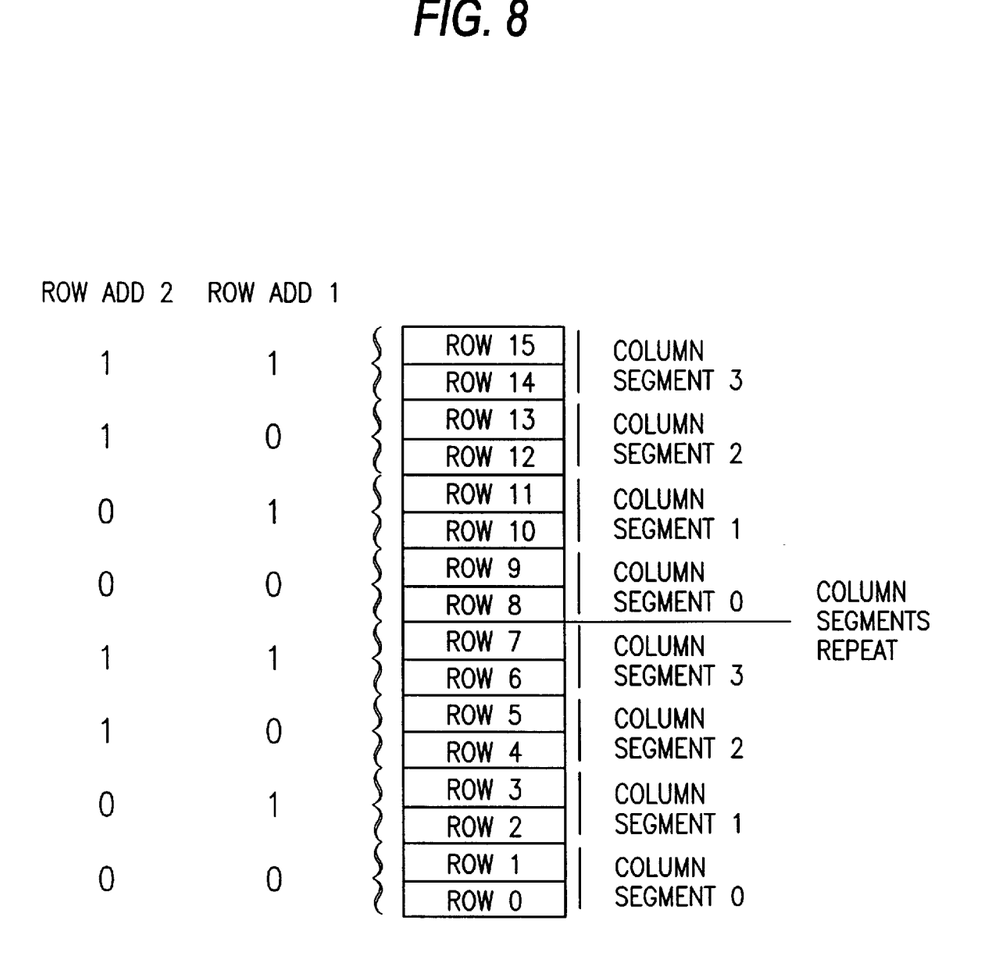
FIG. 8 is a chart illustrating one of the column segmentation arrangements which can be obtained by the FIG. 6 circuit.

When the RowAdd2 and RowAdd1 bits are used as inputs to decoder 204, the column segmentation is different from that of the FIG. 2 circuit. FIG. 7 indicates the output of decoder 204 for each of the possible states of the RowAdd2 and RowAdd1 signals, which is the same truth table associated with decoder 204 of the FIG. 2 circuit; however, FIG. 8 shows how the column segments are now realigned. Referring back to FIG. 5, when the RowAdd2 and RowAdd3 signals are used, the four-column segments are arranged such that rows 12 through 15 are in column segment 3, rows 8 through 11 are in column segment 2, rows 4 through 7 are in column segment 1 and rows 3 through 0 are in column segment 0, as shown in FIG. 5. However, when the Row-Add2 and RowAdd1 signals are used as inputs to decoder 204, the column segmentation is changed to the pattern shown in FIG. 8 where rows 6, 7, 14, 15 are in column segment 3, rows 4, 5, 12, 13 are in column segment 2, rows 2, 3, 10, 11 are in column segment 1 and rows 0, 1, 8, 9 are in column segment 0.

The FIG. 6 circuit again uses the decoder 204 output to select the appropriate one of the latches 220 for each multiplexer 206 to provide at the collective outputs 256 of the multiplexers 206 a programmed address of a defective column associated with each of the column segments. This address is sent to comparator 217 where it is compared to a presented column address and, if a match is found, a redundant column is selected.

Thus, after a memory test is performed and defective cells are identified, two different column segmentation patterns are available which can be used to map redundant column segments to primary column segments. This provides a greater degree of flexibility in repairing out defective column segments.

As noted, in order to maximize flexibility of repair out of defective cells, the column segmentation selection input line 444 can be programmed by a programmable element 470. In the case of an antifuse as programmable element 470, Vcc (i.e., a high signal) is passed to the column segmentation selection input 444 if the antifuse is blown. A low signal is passed to the column segmentation selection input line 444 if the antifuse is not blown. This is often referred to as "programming" the antifuse into one of two states. (Alternatively, a fuse may also be used which is programmed into one of two logic states.) In this way programming of the circuit 400 may be performed after the primary columns have been analyzed for cell failures and after various column segmentation arrangements have been tested for the optimum efficiency and for the segmentation arrangement which best fits the pattern of the cell defects. The more suitable segmentation arrangement is then selected by the programming of element 470.

It should be noted that the invention could also be used to segment word lines of a memory instead of column lines if repairs are based on the use of redundant rows instead of redundant columns.

Figure 9:
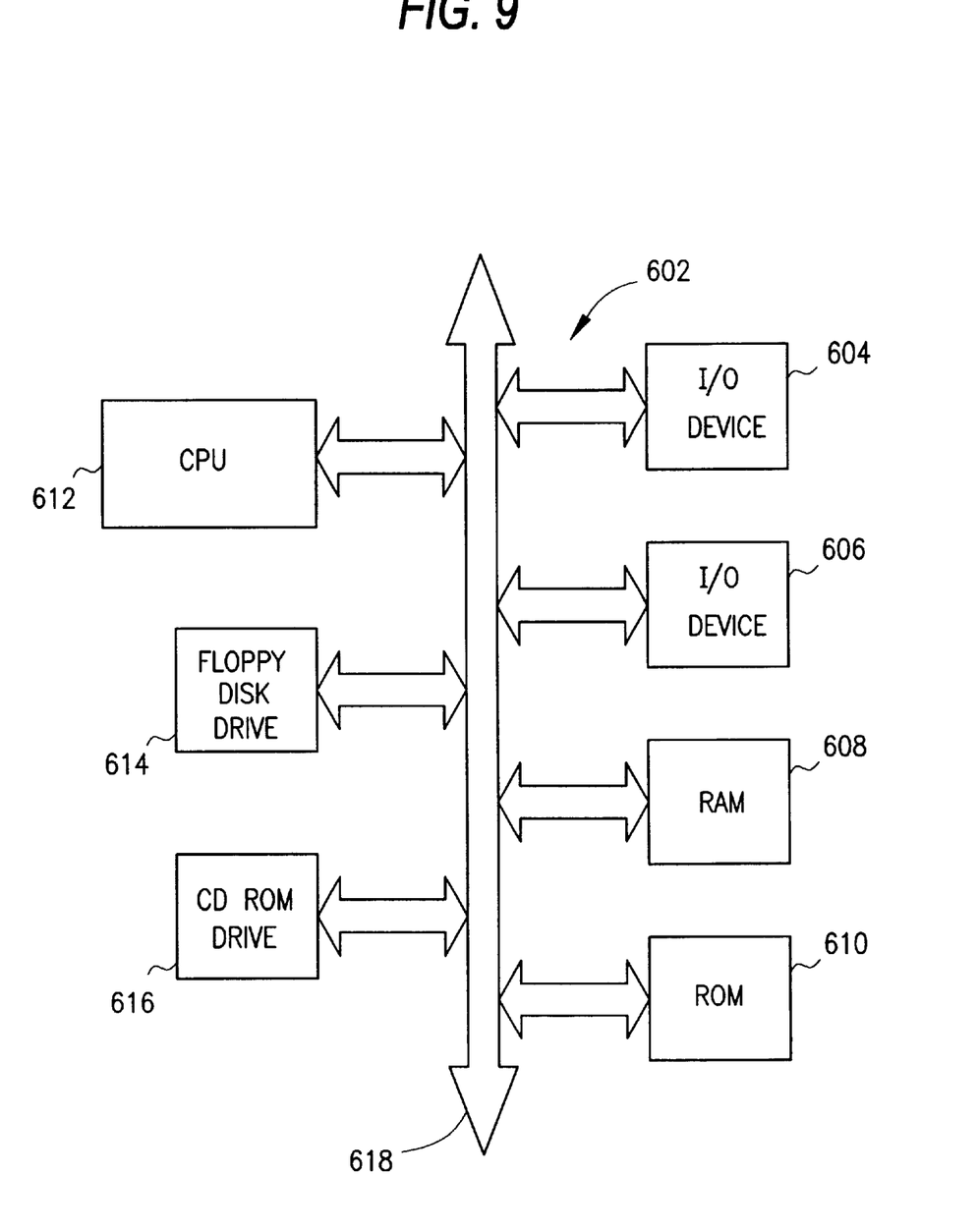
FIG. 9 illustrates a processor system employing a memory device containing the programmable column segmentation circuit of the invention.

FIG. 9 illustrates a simplified processor system 600 which may use memory devices employing the invention as described and illustrated with reference to FIG. 4 and 5. Processor system 600 includes central processing unit (CPU) 612, RAM and ROM memory devices 608, 610, input/output (I/O) devices 604, 606, floppy disk drive 614 and CD ROM drive 616. All of the above components communicate with each other over one or more buses and/or bridges 618. The RAM memory device 608 may be formed as one or more memory modules, each of which contains one or more memory devices which may use the invention as described and illustrated with reference to FIG. 6, to provide for more efficient repair of defective primary columns of memory cells.

While an exemplary embodiment of invention have been described and illustrated, it is to be understood that the above description is intended to be illustrative and not restrictive. Many variations to the above-described circuit and method will be readily apparent to those having ordinary skill in the art.

Accordingly, the present invention is not to be considered as limited by the specifics of the particular circuit and method which have been described and illustrated, but is only limited by the scope of the appended claims.

What is claimed is:

1. A programmable circuit for column repair of a memory device, said circuit comprising:
   an input circuit for receiving an input signal having two possible states, said input circuit generating at least one control signal which changes in response to the state of said input signal;
   a first switching circuit coupled to said input circuit, said switching circuit receiving a plurality of bits of a presented row address signal and selecting at least one of said bits in response to said at least one control signal; and
   a circuit for determining if a defective column address associated with a column segment defined in part by said selected one bit, said determining circuit using the at least one bit of said presented row address signal selected by said first switching circuit to select said defective column address.

2. The circuit of claim 1 wherein said input circuit includes an antifuse, said antifuse selectively providing one of a high and low voltage signal to said first switching circuit based upon a programmed state of said antifuse.

3. The circuit of claim 1 wherein said input circuit includes a fuse, said fuse selectively providing one of a high and low voltage signal to said first switching circuit based upon a programmed state of said fuse.

4. The circuit of claim 1 wherein said first switching circuit receives first and second different bits of said presented row address signal, and provides one of said bits as an output to said selecting circuit in response to said control signal.

5. The circuit as in claim 4 wherein said selecting circuit also uses a third bit of said presented row address signal to select said defective column address.

6. The circuit of claim 5 wherein said first, second and third bits are between a most significant and a least significant bit of said presented row address.

7. The circuit of claim 1 wherein said first switching device is a multiplexer.

8. A circuit as in claim 5 wherein said selecting circuit comprises:
   a decoder for receiving said one of said first and second bits and said third bit and providing therefrom an output representing a column segmentation pattern; and
   a second switching circuit responsive to the output of said decoder for selecting a prestored address pattern from a plurality of prestored address patterns; and
   a comparator for comparing a selected prestored address pattern with a presented column address and determining if a redundant column should be used for a memory operation.

9. A programmable circuit as in claim 8 further comprising:
   a plurality of latch circuits, one for each column segment, associated with each bit position of a defective column address, said second switching circuit selecting those latch circuits associated with a column segment indicated by the output of said decoder to thereby select said prestored address pattern.

10. A programmable circuit as in claim 9 wherein said second switching circuit comprises a plurality of multiplexers, one for each bit position of said address pattern, each said multiplexer being responsive to said output of said decoder to select a lock circuit corresponding to a column segment indicated by the output of said decoder.

11. A column repair circuit for a memory device comprising:

a decoder circuit for receiving predetermined bits of a presented row address;

a selection circuit for selecting which predetermined bits of a presented row address are received by said decoder circuit;

a programmable circuit for programming defective column addresses associated with defective memory cells of said memory device;

a switching circuit responsive to the output of said decoder for selecting a defective column address from said programmable circuit; and a comparator for comparing a selected defective column address with a presented column address and indicating whether they match.

12. A circuit as in claim 11 wherein said switching circuit selects a defective column address associated with a column segment identified by said decoder circuit.

13. A processor system comprising:

a processor; and a memory device coupled to said processor, said memory device comprising a programmable circuit for column repair of a memory device, said circuit comprising:

an input circuit for receiving an input signal having two possible states, said input circuit generating at least one control signal which changes in response to the state of said input signal;

a first switching circuit coupled to said input circuit, said switching circuit receiving a plurality of bits of a presented row address signal and selecting at least one of said bits in response to said at least one control signal; and a circuit for determining if a defective column address associated with a column segment defined in part by said selected one bit, said determining circuit using the at least one bit of said presented row address signal selected by said first switching circuit to select said defective column address.

14. The system of claim 13 wherein said input circuit includes an antifuse, said antifuse selectively providing one of a high and low voltage signal to said first switching circuit based upon a programmed state of said antifuse.

15. The system of claim 13 wherein said input circuit includes a fuse, said fuse selectively providing one of a high and low voltage signal to said first switching circuit based upon a programmed state of said fuse.

16. The system of claim 13 wherein said first switching circuit receives first and second different bits of said presented row address signal, and provides one of said bits as an output to said selecting circuit in response to said control signal.

17. The system of claim 16 wherein said selecting circuit also uses a third bit of said presented row address signal to select said defective column address.

18. The system of claim 17 wherein said first, second and third bits are between a most significant and a least significant bit of said presented row address.

19. The system of claim 13 wherein said first switching device is a multiplexer.

20. The system of claim 17 wherein said selecting circuit comprises:

a decoder for receiving said one of said first and second bits and said third bit and providing therefrom an output representing a column segmentation pattern; and a second switching circuit responsive to the output of said decoder for selecting a prestored address pattern from a plurality of prestored address patterns; and a comparator for comparing a selected prestored address pattern with a presented column address and determining if a redundant column should be used for a memory operation.

21. A processor system comprising:

a processor; and a memory device coupled to said processor, said memory device comprising a column segmentation circuit, said circuit comprising:

a programmable circuit for programming (1) a defective column address associated with a column segment of a first column segmentation pattern, and (2) a defective column address associated with a column segment of a second column segmentation pattern;

a programmable selection circuit for selecting one of said first and second segmentation patterns;

a switch circuit responsive to a selected segment of a selected segmentation pattern for selecting a defective column address associated with a selected segment of said selected segmentation pattern; and a comparator for comparing said selected defective column address with a presented column address to determine if a redundant column should be selected.

22. A processing system comprising:

a decoder circuit for receiving predetermined bits of a presented row address;

a selection circuit for selecting which predetermined bits of a presented row address are received by said decoder circuit;

a programmable circuit for programming defective column addresses associated with defective memory cells of said memory device;

a switching circuit responsive to the output of said decoder for selecting a defective column address from said programmable circuit; and a comparator for comparing a selected defective column address with a presented column address and indicating whether they match.

23. A system as in claim 22 wherein said switching circuit selects a defective column address associated with a column segment identified by said decoder circuit.

24. A method for repairing out defective memory cells of a memory device, said method comprising:

selecting one of a plurality of available column segmentation patterns for said memory device;

using said selected segmentation pattern when a row address is presented to select a stored column address associated with said row address and selected segmentation pattern; and comparing said selected column address with a presented column address to determine if a redundant column address should be used for a memory operation.

* * * * *